(12) United States Patent  (10) Patent No.: US 6,749,011 B2
Horng et al.  (45) Date of Patent: Jun. 15, 2004

(54) HEAT SINK

(75) Inventors: Alex Horng, Kaohsiung (TW);
Yin-Rong Hong, Kaohsiung (TW);
Ching-Sheng Horng, Kaohsiung (TW)

(73) Assignee: Sunonwealth Electric Machine Industry Co., Ltd. (TW)

( * ) Notice: Subject to any disclaimer, the term of this patent is extended or adjusted under 35 U.S.C. 154(b) by 0 days.

(21) Appl. No.: 10/214,564
(22) Filed: Aug. 9, 2002
(65) Prior Publication Data
US 2004/0026073 A1 Feb. 12, 2004
(51) Int. Cl.$^7$ ................................................ H05K 7/20
(52) U.S. Cl. ........................................ 165/80.3; 361/704
(58) Field of Search .............................. 165/80.3, 182, 165/185; 361/704, 710, 697

(56) References Cited

U.S. PATENT DOCUMENTS 5,509,465 A * 4/1996 Lai ........................... 165/80.3

* cited by examiner

*Primary Examiner*—Allen Flanigan
(74) *Attorney, Agent, or Firm*—Bacon & Thomas, PLLC

(57) ABSTRACT

A heat sink. The heat sink includes spaced laminas made of a thermally conductive material. Each of the laminas is integrally formed with a pair of convexo-concave spacers that each project from a first face of the lamina and define a cavity in a second face of the same lamina. Furthermore, each of the convexo-concave spacers is adapted to be partially and tightly fitted in a mating cavity of the next lamina.

6 Claims, 7 Drawing Sheets

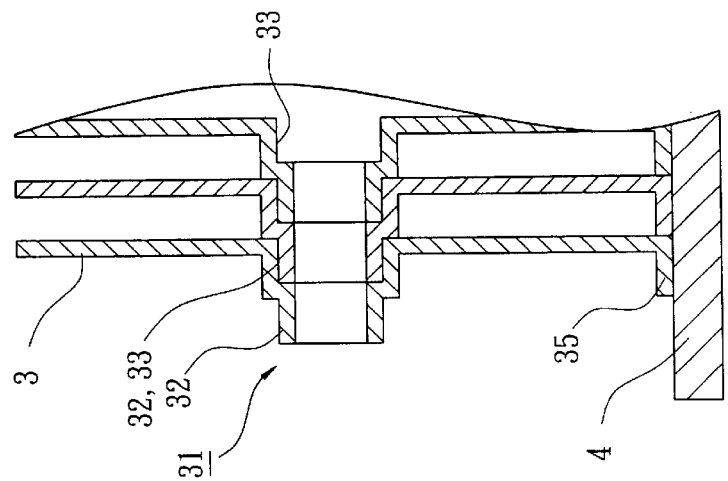
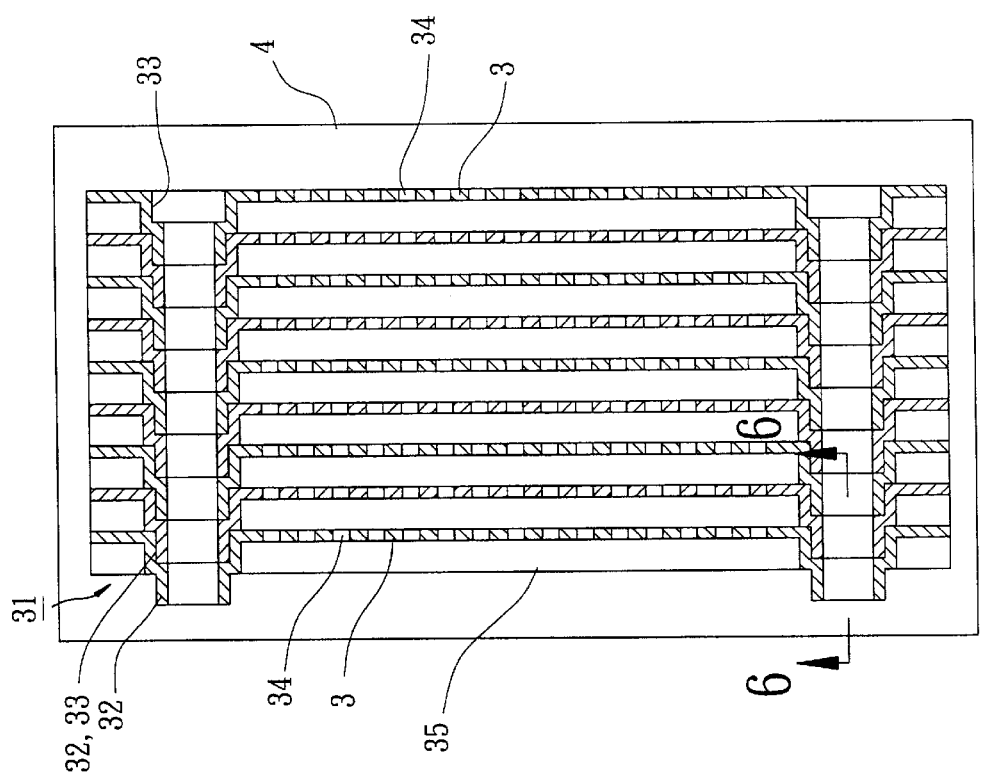

HEAT SINK

BACKGROUND OF THE INVENTION

1. Field of the Invention

The present invention relates to a heat sink and, more particularly, to a heat sink in which a plurality of laminas can easily be connected together.

2. Description of Related Art

Heat sinks are widely used for Central Processing Units. As shown in FIG. 9, a heat sink includes a plurality of laminas 90 and a tube 96 extending through the laminas 90. Each of the laminas 90 consists of an upper member and a lower member, with each member having an outer flange 91 formed with a pair of first tenons 93 and an inner flange 92 formed with a second tenon 95.

The inner flange 92 is situated between a pair of lips 94, which are below the inner flange 92 for the upper member but above the inner flange 92 for the lower member. The two members of the same lamina 90 can be coupled to each other by connecting the lips 94 of the upper member to those 94 of the lower member. The achieved laminas 90 are then connected together by inserting the tenons 93, 95 of each lamina 90 into corresponding mortises of the next laminas 90. As a result of this connection, all of the inner flanges 92 define a channel in which the tube 96 is tightly received.

Although the conventional heat sink can be used to dissipate heat derived from a heat source, its laminas 90 are complex and not easy to be connected together.

OBJECT OF THE INVENTION

The object of the present invention is to provide a heat sink in which a plurality of laminas can easily be connected together.

SUMMARY OF THE INVENTION

The present invention provides a heat sink comprising a plurality of spaced laminas made of a thermally conductive material. Each of the laminas is integrally formed with a pair of convexo-concave spacers that each project from a first face of the lamina and define a cavity in a second face of the same lamina. In addition, each of the convexo-concave spacers is adapted to be partially and tightly fitted in a mating cavity of the next lamina.

Other objects, advantages and novel features of this invention will become more apparent from the following detailed description when taken in conjunction with the accompanying drawings.

BRIEF DESCRIPTION OF THE DRAWINGS

FIG. 5 is a cross-sectional top view of the heat sink of FIG. 4;

FIG. 6 is an enlarged cross-sectional view taken along lines 6—6 in FIG. 5;

DETAILED DESCRIPTION OF THE PREFERRED EMBODIMENT

Figure 1:
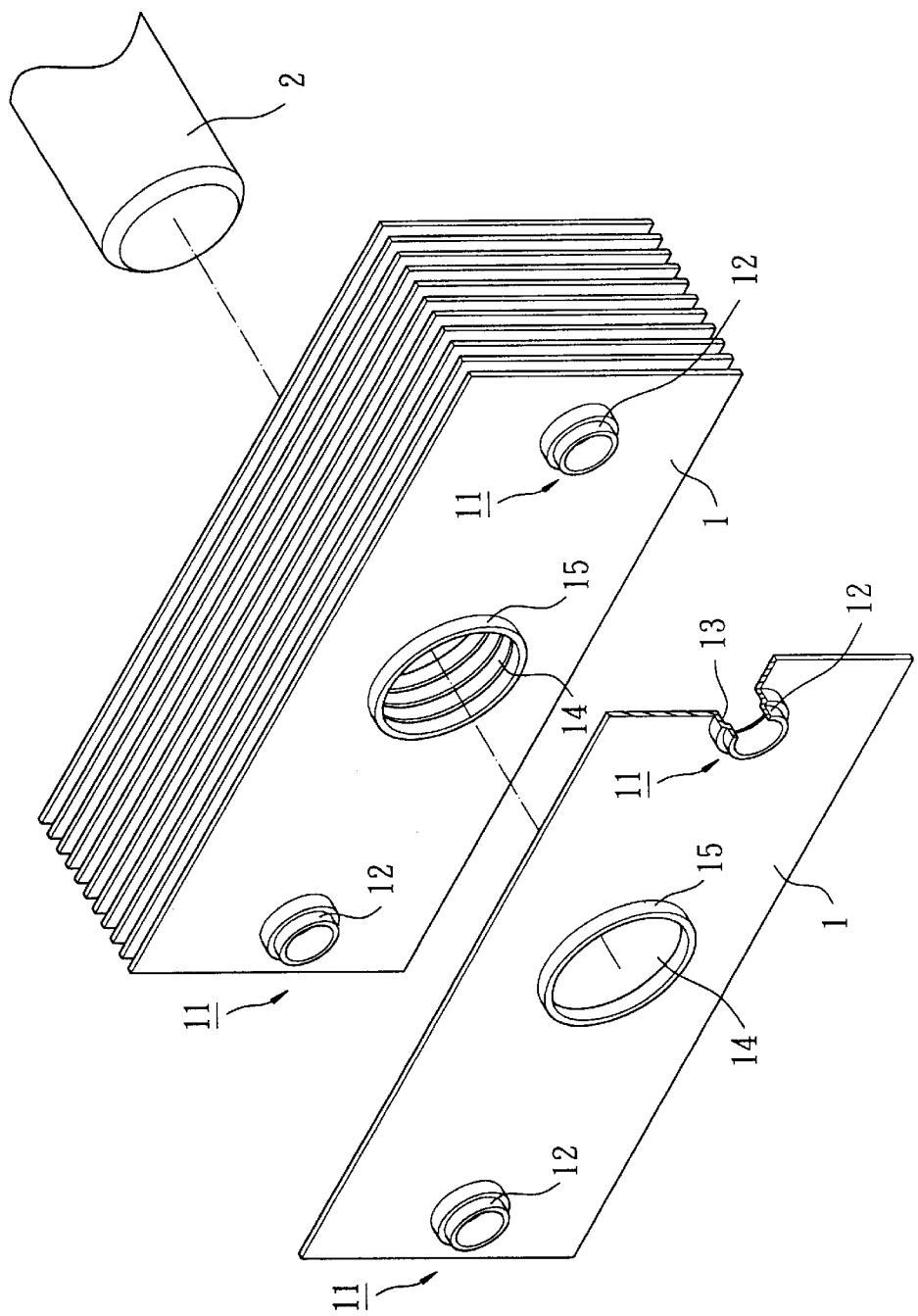
FIG. 1 is an exploded perspective view of a first embodiment of a heat sink in accordance with the present invention.

Referring to FIG. 1, there is shown a first embodiment of a heat sink in accordance with the present invention. The inventive heat sink includes a plurality of spaced laminas 1 and a heat conductor 2 extending through the laminas 1.

Each of the laminas 1 is made of a thermally conductive material, such as copper, and is integrally formed with a pair of convexo-concave spacers 11 that each project from a first face of the lamina 1 and define a cavity 13 in a second face of the same lamina 1. In the first embodiment, each of the spacers 11 has a small-diameter end 12 adapted to be tightly fitted in a mating cavity 13 of the next lamina 1, thereby connecting the laminas 1 together and spacing the laminas 1 one from another.

Each of the laminas 1 further has an opening 14 for receiving the heat conductor 2. Preferably, the opening 14 is surrounded by a collar 15 to make an improved thermal contact with the conductor 2.

Figure 3:
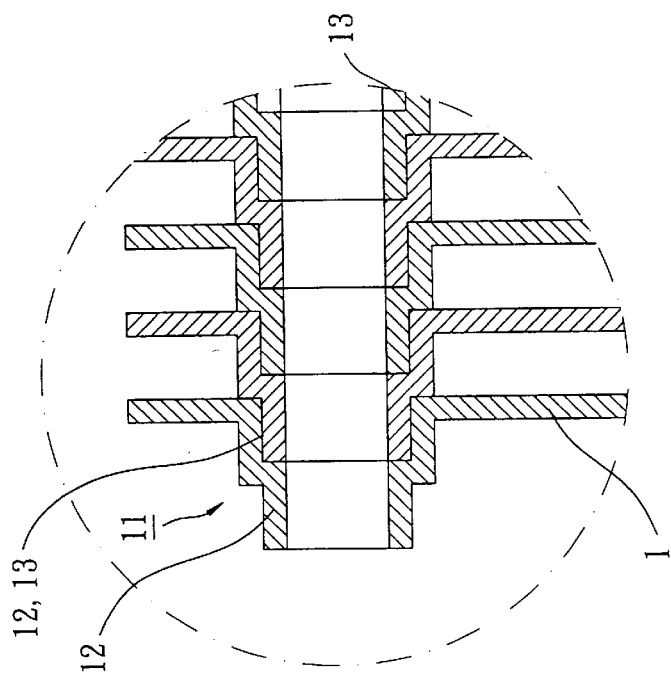
FIG. 3 is an enlarged sectional view taken from part 3 in FIG. 2.
Figure 2:
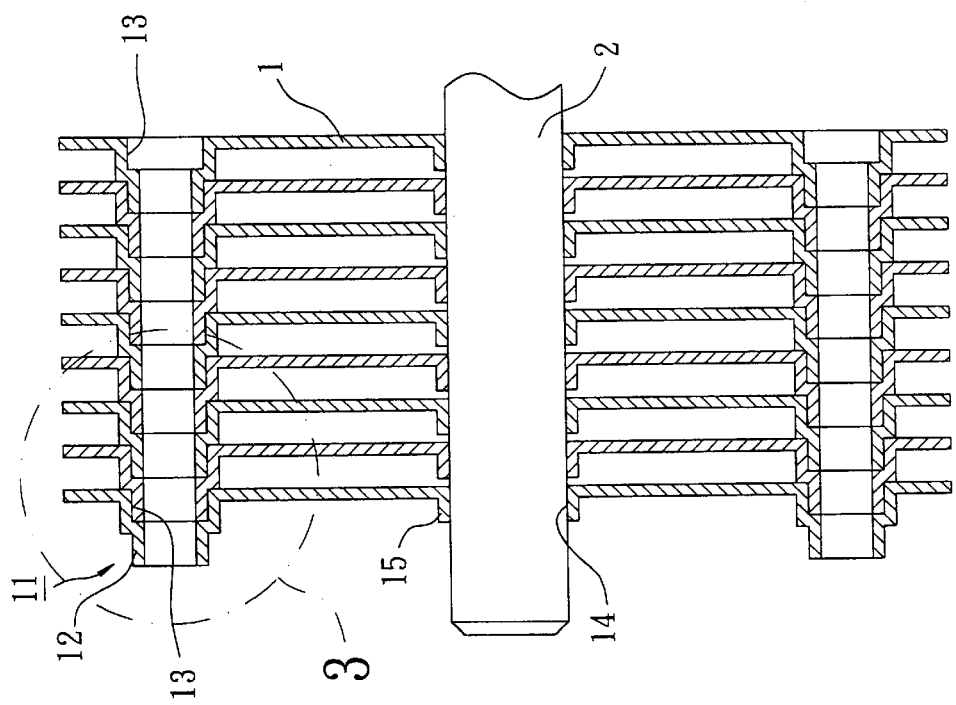
FIG. 2 is a cross-sectional top view of the heat sink of FIG. 1.

Referring to FIGS. 2 and 3, the laminas 1 can be connected together by fitting the small-diameter ends 12 of the spacers 11 tightly into the mating cavities 13 of the next lamina 1. The tight fitting relationship between the laminas 1 enables the heat from the conductor 2 to be quickly conducted to all of the laminas 1 and then to be dissipated effectively.

Figure 4:
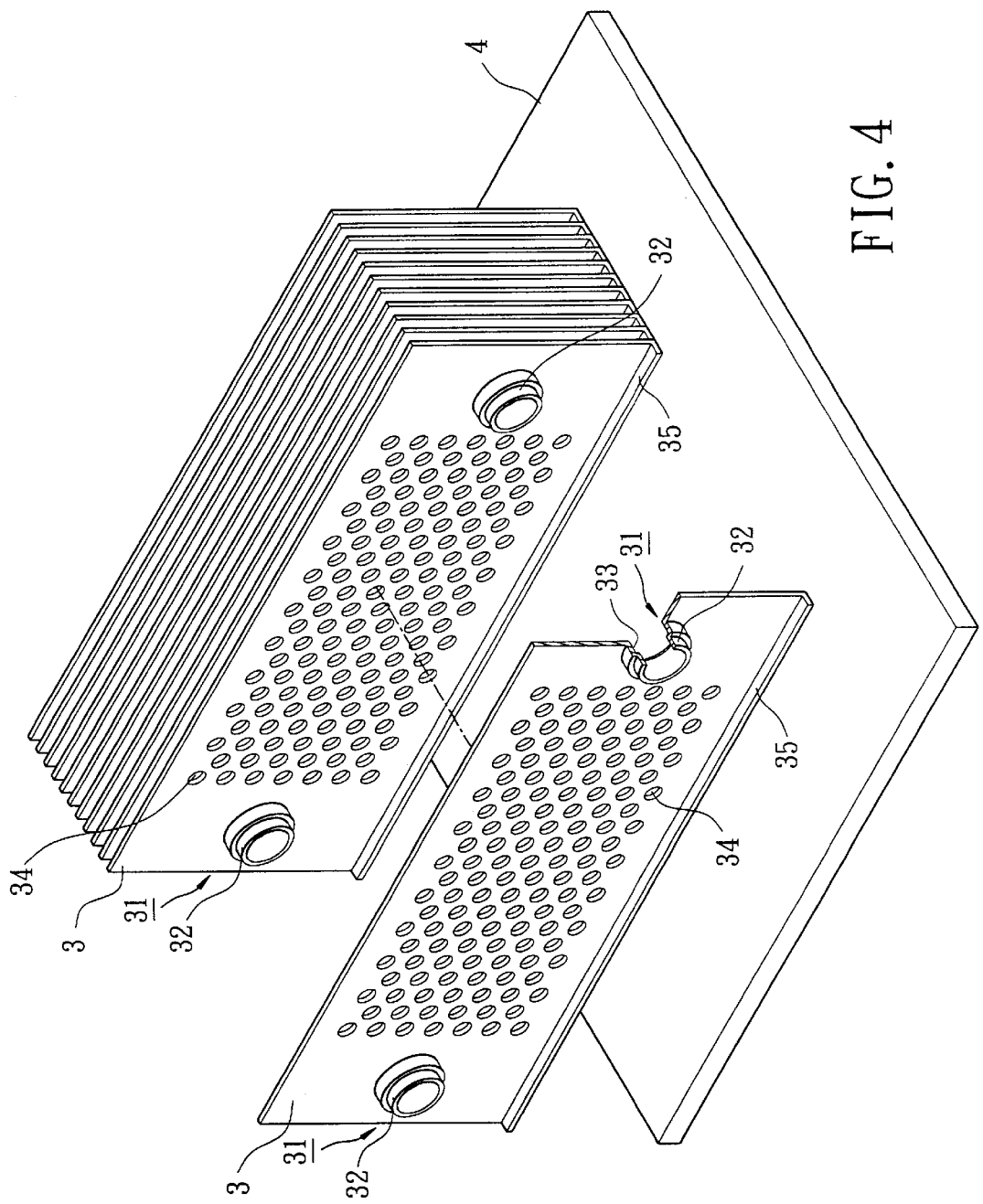
FIG. 4 is an exploded perspective view of a second embodiment of the inventive heat sink.

Referring to FIG. 4, a second embodiment of the inventive heat sink is shown. Each lamina 3 here is also made of a thermally conductive material, and is integrally formed with a pair of convexo-concave spacers 31 that each have a small-diameter end 32 adapted to be tightly fitted in a mating cavity 33 of the next lamina 31, as best shown in FIG. 5. As a result, these laminas 3 can easily be connected together and spaced one from another.

In this embodiment, however, each of the laminas 3 is formed with a plurality of vents 34 for enhancing airflow, and an angled edge 35 in thermal contact with a heat conductor plate 4.

As best shown in FIG. 6, the edge 35, which preferably makes a right angle with the lamina 3, abuts the heat conductor plate 4, and so heat can be conducted quickly from the plate 4 to the lamina 3 through the extended edge 35 and can be dissipated by airflow passing through the vents 34.

Figure 7:
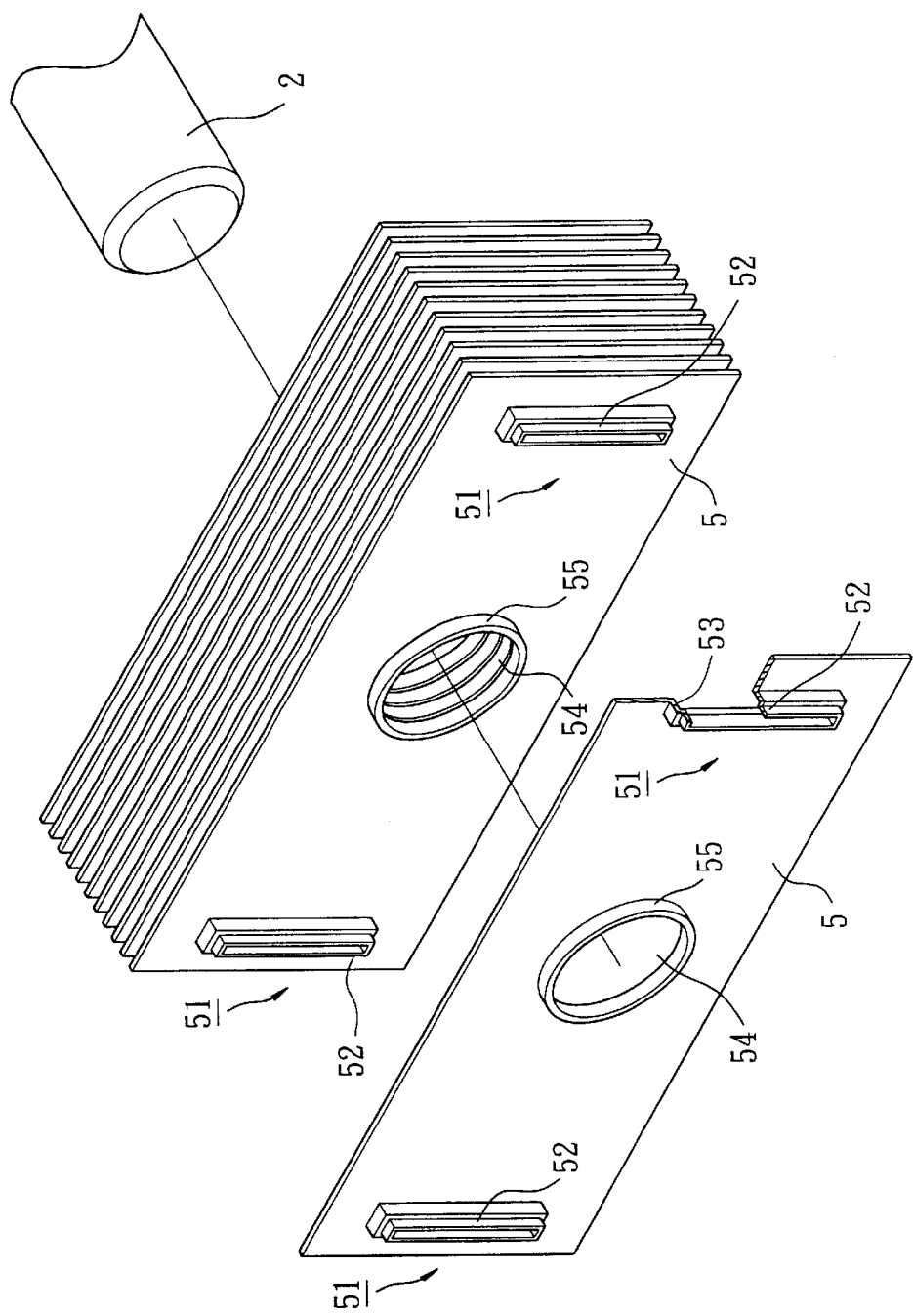
FIG. 7 is an exploded perspective view of a third embodiment of the inventive heat sink.

Referring to FIG. 7, a third embodiment of the inventive heat sink is shown now. As can be seen, this embodiment is similar to the first one, that is, each lamina 5 here is also made of a thermally conductive material and has an opening 54 surrounded by a collar 15 that is in thermal contact with a conductor 2.

However, each of the laminas 5 is now integrally formed with a pair of elongated convexo-concave spacers 51, each projecting from a first face of the lamina 5 and defining a cavity 53 in a second face of the same lamina 5. Furthermore, each of the elongated spacers 51 has a stepped end 52 adapted to be tightly fitted in a mating cavity 53 of the next lamina 5. Therefore, these laminas Scan be connected together as easily as those in the first and second embodiments. As shown in FIG. 7, preferably the opening 54 is surrounded by a collar 55 to make an improved thermal contact with the conductor 2.

Figure 8:
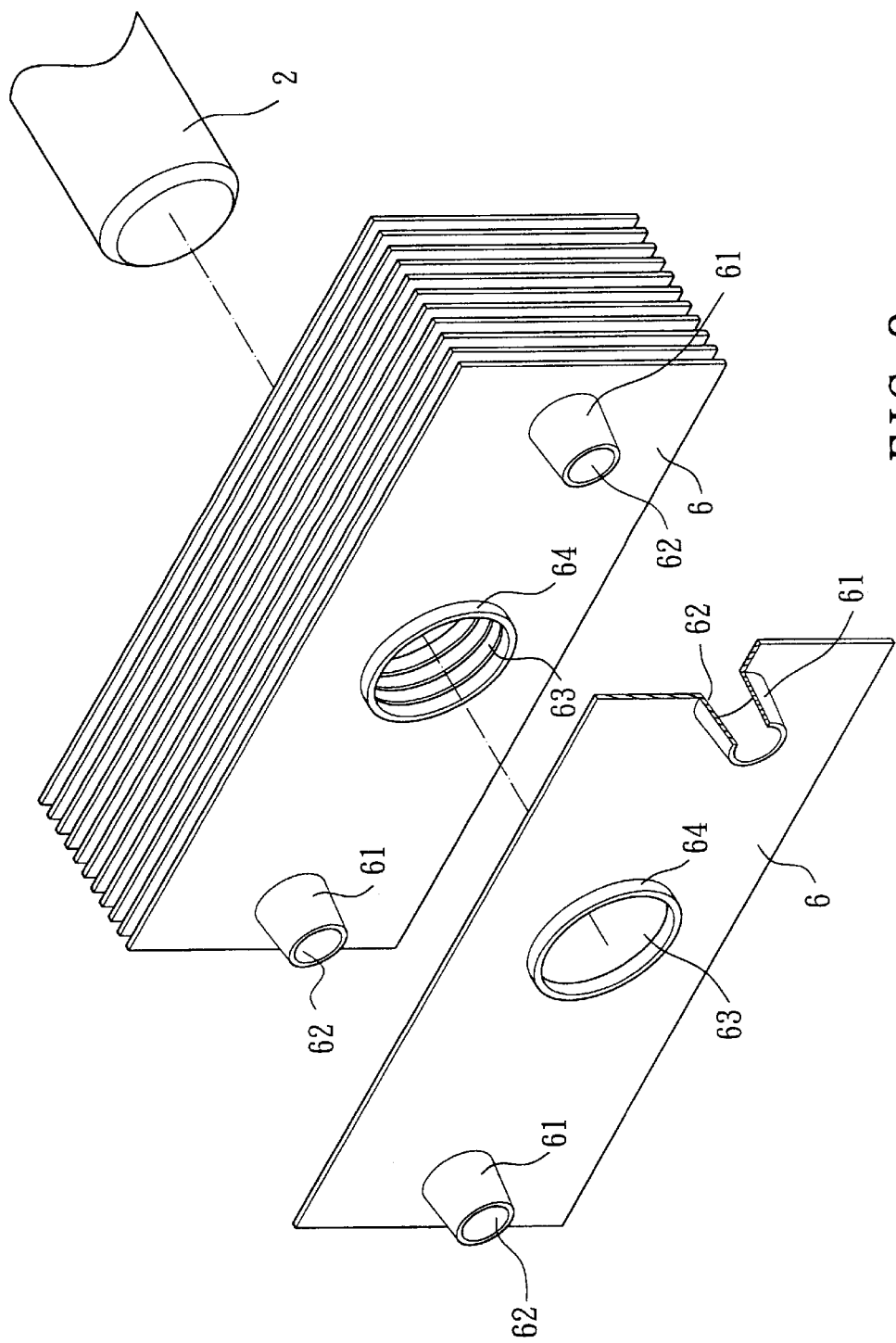
FIG. 8 is an exploded perspective view of a fourth embodiment of the inventive heat sink.
Figure 9:
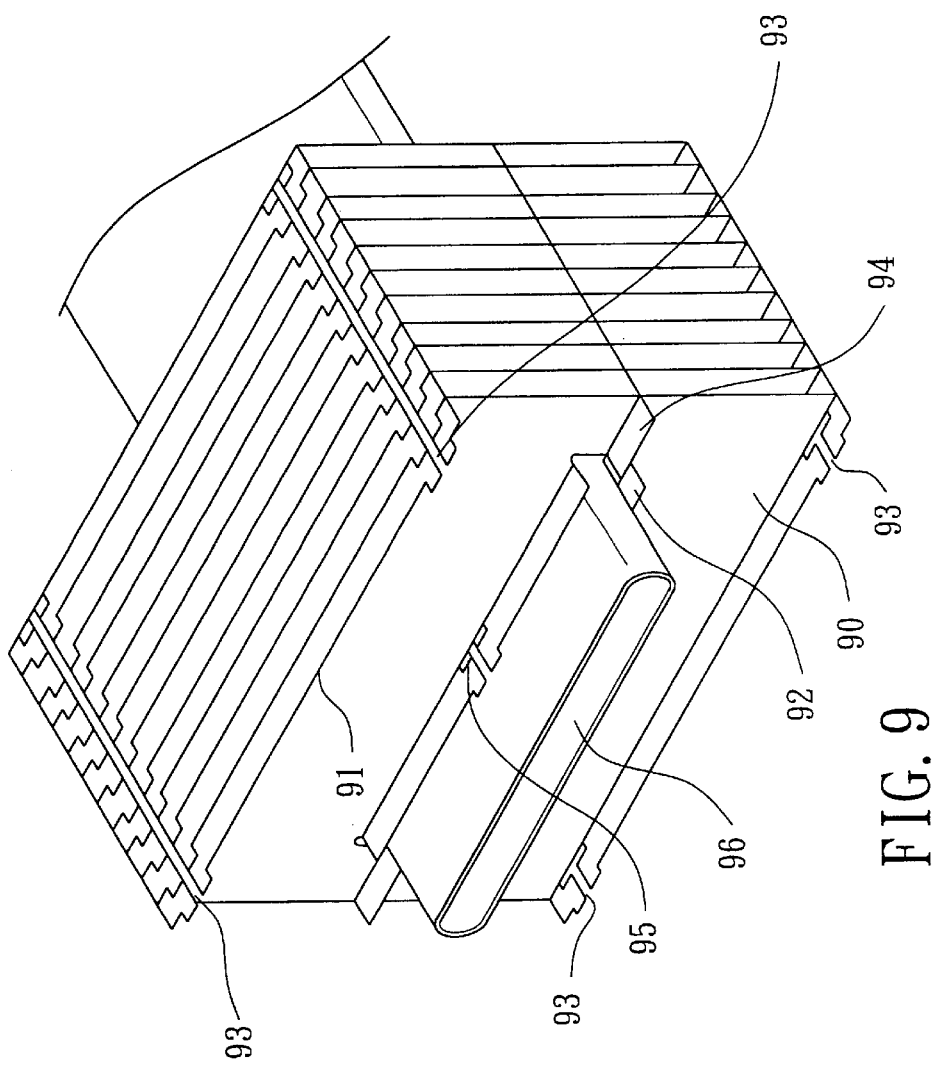
FIG. 9 is a perspective view of a conventional heat sink.

Referring to FIG. 8, a fourth embodiment of the inventive heat sink is shown now. Again, each lamina 6 here is made of a thermally conductive material and has an opening 63 surrounded by a collar 64 in thermal contact with a conductor 2.

In the last embodiment, however, each of the laminas 6 is integrally formed with a pair of convexo-concave spacers 61 that have a tapered configuration. Each of the tapered spacers 61 projects from a first face of the lamina 6 and defines a cavity 62 in a second face of the same lamina 6, with an outer periphery of the spacer 61 being tapered in the same way as the cavity 62. In this configuration, these spacers 61 can be partially and tightly fitted in mating cavities 62 of the next lamina 6, thus allowing the laminas 6 to be easily connecting together.

From the foregoing, it is apparent that this invention has the advantage of enabling the laminas to be easily connected together.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat sink comprising:

a plurality of spaced laminas made of a thermally conductive material, each of said laminas being integrally formed with at least one convexo-concave spacer having a tapered configuration projecting from a first face of said lamina and defining a cavity in a second face of said lamina, and said convexo-concave spacer being adapted to be partially and tightly fitted in a mating cavity of the next lamina;

wherein each of said laminas has an opening for receiving a heat conductor, and a vent array for additional heat dissipation; and wherein each of said laminas further comprises a collar surrounding said opening and in contact with said heat conductor.

2. The heat sink as claimed in claim 1, wherein said convexo-concave spacer has a small-diameter end adapted to be tightly fitted in a mating cavity of said next lamina.

3. A The heat sink as claimed in claim 1, wherein said convexo-concave spacer is adapted to be partially and tightly fitted in a mating cavity of said next lamina.

4. The heat sink as claimed in claim 3, wherein said convexo-concave spacer has an outer periphery tapered in the same way as said cavity.

5. The heat sink as claimed in claim 1, wherein each of said laminas has an angled edge in thermal contact with a heat conductor plate.

6. The heat sink as claimed in claim 1, wherein each of said laminas has a plurality of vents defined therein.

* * * * *